United States Patent
Tong et al.

(10) Patent No.: US 7,763,552 B2
(45) Date of Patent: Jul. 27, 2010

(54) METHOD OF INTERCONNECT FORMATION USING FOCUSED BEAMS

(75) Inventors: William M. Tong, Palo Alto, CA (US); Duncan Stewart, Palo Alto, CA (US); R. Stanley Williams, Palo Alto, CA (US); Manish Sharma, New Delhi (IN); Zhiyong Li, Palo Alto, CA (US); Gary A. Gibson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 916 days.

(21) Appl. No.: 11/413,476

(22) Filed: Apr. 28, 2006

(65) Prior Publication Data

US 2007/0252131 A1 Nov. 1, 2007

(51) Int. Cl.
 *H01L 21/768* (2006.01)
 *H01L 21/62* (2006.01)

(52) U.S. Cl. .............. 438/795; 257/E21.592; 257/E21.004; 257/E21.52

(58) Field of Classification Search .......... 257/38, 257/39, 41, E21.002, E21.003, E21.004, 257/E21.005, E21.006, E21.007, E21.024, 257/E21.036, E21.041, E21.042, E21.043, 257/E21.045, E21.049, E21.05, E21.317, 257/E21.351, E21.459, E21.538, E23.038, 257/E23.039, E23.04, E23.165, E21.328, 257/E21.471, E21.52, E21.532, E21.533, 257/E21.534, E21.535, E21.536, E21.575; 365/151; 438/795, 798, 799
See application file for complete search history.

(56) References Cited

U.S. PATENT DOCUMENTS

| | | | |
|---|---|---|---|
| 4,545,111 A | 10/1985 | Johnson | |
| 4,912,066 A | 3/1990 | Wills | |
| 5,478,698 A | 12/1995 | Rostoker et al. | |
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,432,740 B1 * | 8/2002 | Chen | 438/99 |
| 6,458,621 B1 | 10/2002 | Beck | |
| 6,459,095 B1 | 10/2002 | Heath et al. | |
| 6,512,119 B2 | 1/2003 | Bratkovski et al. | |
| 6,559,468 B1 | 5/2003 | Kuekes et al. | |
| 6,707,063 B2 | 3/2004 | Chen | |
| 6,753,561 B1 * | 6/2004 | Rinerson et al. | 257/295 |
| 6,846,682 B2 | 1/2005 | Heath et al. | |
| 6,855,647 B2 | 2/2005 | Beck et al. | |

(Continued)

OTHER PUBLICATIONS

Chabinyc, Michael L., "Molecular Rectification in a Metal-Insulator-Metal Junction Based on Self-Assembled Monolayers," J. Am. Chem. Soc., vol. 124, No. 39, pp. 11730-11736, 2002.

(Continued)

*Primary Examiner*—Lynne A Gurley
*Assistant Examiner*—Andrew O. Arena (57) ABSTRACT

A method of forming an electrical interconnect, which includes a first electrode, an interlayer of a programmable material disposed over at least a portion of the first electrode, and a second electrode disposed over the programmable material at a non-zero angle relative to the first electrode. The interlayer includes a modified region having differing electrical properties than the rest of the interlayer, sandwiched at the junction of the first electrode and the second electrode. The interlayer may be exposed to a focused beam to form the modified region.

20 Claims, 4 Drawing Sheets

U.S. PATENT DOCUMENTS

| | | | |
|---|---|---|---|
| 6,858,905 | B2 | 2/2005 | Hsu et al. |
| 2003/0186466 | A1* | 10/2003 | Chen .......................... 438/1 |
| 2007/0117256 | A1* | 5/2007 | Stewart et al. ................ 438/99 |

OTHER PUBLICATIONS

Chen, Yong, et al., "Nanoscale molecular-switch devices fabricated by imprint lithography," Appl. Phys. Lett., vol. 82, No. 10, pp. 1610-1612, Mar. 10, 2003.

Guo, Lingjie, et al., "Nanoscale silicon field effect transistors fabricated using imprint lithography," Appl. Phys. Lett., vol. 71, No. 13, pp. 1881-1883, Sep. 29, 1997.

Guo, Lingjie, et al., "A Silicon Single-Electron Transistor Memory Operating at Room Temperature," Science, vol. 275, pp. 649-651, Jan. 31, 1997.

Prymak, John D., "Improvements with Polymer Cathodes in Aluminum and Tantalum Capacitors," IEEE 2001—APEC Conference 2001, 9 pages.

Stan, Mircea R., et al., "Molecular Electronics: From Devices and Interconnect to Circuits and Architecture," Proceedings of the IEEE, vol. 91, No. 11, pp. 1940-1957, Nov. 2003.

Stewart, D.R., et al., "Molecule-Independent Electrical Switching in Pt/Organic Monolayer/Ti Devices," Nano Lett., vol. 4, No. 1, pp. 133-136, 2004.

Tans, Sander J., et al., "Room-temperature transistor based on a single carbon nanotube," Nature, vol. 393, pp. 49-52, May 7, 1998.

* cited by examiner

METHOD OF INTERCONNECT FORMATION USING FOCUSED BEAMS

FIELD OF THE INVENTION

The present invention relates to an electronic device having a functional length scale that is measured in nanometers. More specifically, the present invention relates to modifying an electrical connection in a nanometer scale (nanoscale) electronic device.

BACKGROUND OF THE INVENTION

The silicon-integrated circuit has dominated electronics and has helped the industry grow to become one of the world's largest industries. However, due to a combination of physical and economic reasons, the miniaturization that has accompanied the growth of silicon integrated circuits is reaching its limit. The present scale of electronic devices is on the order of tenths of micrometers ($\mu m$). However, new solutions are being proposed to form electronic devices on an ever smaller scale, such as a nanometer (nm) scale.

Prior proposed solutions to the problem of constructing nanometer scale devices have involved (1) the utilization of extremely fine scale lithography using X-rays, electron, ions, scanning probes, or stamping to define the device components; (2) direct writing of the device components by electrons, ions, or scanning probes; or (3) the direct chemical synthesis and linking of components with covalent bonds. However, the wafer on which the devices are built must be aligned to within a fraction of a nanometer in at least two dimensions for several successive stages of lithography, followed by etching or deposition to build the devices. This level of control will be extremely expensive to implement. The second proposed solution is a serial process, and direct writing a wafer full of complex devices, each containing trillions of components, could well require many years. Finally, with regard to the third proposed solution, the only known chemical analogues of high information content circuits are proteins and DNA, both of which have extremely complex and, to date, unpredictable secondary and tertiary structures that causes them to twist into helices, fold into sheets, and form other complex 3D structures that will have a significant and usually deleterious effect on their desired electrical properties, as well as make interfacing them to the outside world impractical.

One conventional approach to nanometer-scale devices, includes use of crossed nano-scale wires that are joined at their intersecting junctions with bi-stable molecules. Wires, such as silicon, carbon and/or metal, are formed in two dimensional arrays. A bi-stable molecule, such as rotaxane, pseudo-rotaxane, or catenane, is formed at each intersection of a pair of wires. The bi-stable molecule is switchable between two states upon application of a voltage along a selected pair of wires.

One conventional method of constructing a nanometer scale transistor (a three-terminal device with gain) involves the precise positioning of three or four components within a nanometer. A quantum dot is positioned between two wires, which act as the source and drain of the transistor, in tunneling contact with the quantum dot. This is known as a single-electron transistor, or SET. A third wire is positioned in capacitive contact with the dot, which is the gate. The voltage on the gate changes the energy levels in the quantum dot, which creates a Coulomb blockade to current flowing from the source to the drain.

BRIEF SUMMARY OF THE INVENTION

The present invention relates to a method of forming an electrical interconnect. The method includes providing a first electrode, forming a programmable interlayer in contact with the first electrode, forming a second electrode in contact with the programmable interlayer, and exposing the programmable interlayer to a focused beam for a predetermined length of time to form a modified region in electrical contact with the first electrode and the second electrode. The modified region may have modified electrical properties.

The present invention also relates to a nanoscale electronic device. The nanoscale electronic device includes a first electrode, a region of a programmable interlayer having modified electrical properties in electrical contact with the first electrode, and a second electrode in electrical contact with the modified region of the programmable interlayer. The programmable interlayer may have a thickness ranging from approximately 10 nm to approximately 100 nm.

The present invention also relates to a method of forming a nanoscale electronic device. The method includes providing a substrate, forming a plurality of first electrodes on the substrate, forming a programmable interlayer in electrical contact with the first electrode, forming a plurality of second electrodes in electrical contact with the programmable interlayer, the plurality of first electrodes crossing the plurality of first electrodes at non-zero angles to form a plurality of junctions, and exposing the programmable interlayer to a focused beam for a predetermined length of time at each junction to form a modified region at each junction.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

The present invention, in a number of embodiments, includes interconnect devices which are ohmic resistor-like, and programmable 3-terminal structures. A method of forming an interconnect device using a focused beam is disclosed.

By using a focused beam to program a material, the desired conductivity may be controlled in a nanoscale electronic device, such as in a nonvolatile memory device. The material's electrical properties may be susceptible to controlled modification by the beam, focused to nanometer resolution. As used herein, the phrase "nanoscale electronic device" refers to an electronic device having dimensions that range from approximately 10 nm to approximately 100 nm. In contrast, the phrase "micronscale electronic device" refers to an electronic device having dimensions that range from approximately 1 μm to a few μm in size and the phrase "submicronscale electronic device" refers to an electronic device having dimensions that range from approximately 0.04 μm to approximately 1 μm in size.

Figures 1, 2:
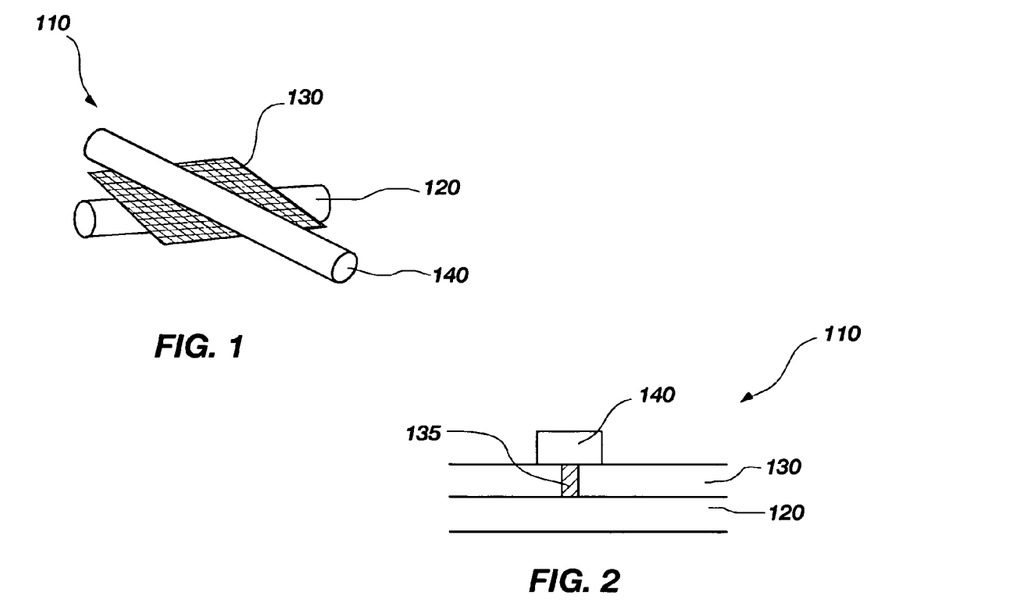
FIGS. 1-3 are schematic illustrations of an embodiment of a nanoscale electronic device formed by a method of the present invention.

An interconnect device 110 according to an embodiment of the present invention is shown in FIGS. 1 and 2. The interconnect device 110 includes a first electrode 120, an interlayer 130 of a programmable material disposed over at least a portion of the first electrode 120 and a second electrode 140 disposed over the programmable material 130 at a non-zero angle relative to the first electrode 120. The interlayer 130 includes a modified region 135, shown in FIG. 2, sandwiched at the intersection, or junction, of the first electrode 120 and the second electrode 140.

The interconnect devices may include switches such as crossbar circuit structures and crossbar memory structures, or programmable three-terminal structures as described in U.S. Pat. No. 6,128,214, No. 6,256,767, and No. 6,559,468 to Kuekes et al. and U.S. Pat. No. 6,458,621 to Beck, which are assigned to the assignee of the present invention and are incorporated by reference in their entirety herein. The crossbar memory structure may include an array of switches that connect a wire in one set of parallel wires to every member of a second set of parallel wires that intersects the first set. The programmable material may be used in the crossbar circuit structure or the crossbar memory structure in place of switch molecules, such as those described in U.S. Pat. Nos. 6,128, 214 and 6,256,767. As such, the programmable material may be sandwiched between the electrodes or wires of the crossbar memory structure.

The first electrode 120 and the second electrode 140 may comprise any conductive material, for example, metal, semiconductor, semi-metal, conducting oxide, conducting organic. Exemplary metals include platinum, titanium, silver, and aluminum, including combinations thereof. The programmable material of the interlayer 130 may comprise any material, inorganic or organic, that may be modified by exposure to a focused beam, as described hereinbelow, to modify the conductivity of the material.

Figure 3:
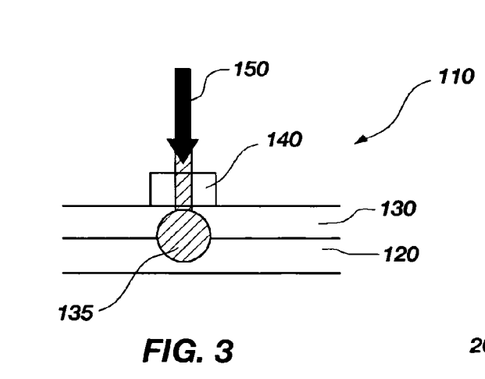

An exemplary method of making the interconnect device 110 is illustrated in FIG. 3. A focused beam 150 may be directed toward the interconnect device 110. The focused beam 150 may be, for example, an electron beam (e−), an ion beam (I+), or a photon beam (hV) such as an X-ray. The beam may be focused to nanometer resolution to deliver the appropriate dose of the localized beam. The beam may modify the electrical properties of the interlayer 130 in the modified region 135. The degree of modification may vary depending on the type of focused beam used, the energy of the beam, the local energy field in a substrate on which the electrodes 120, 140 are positioned, the temperature of the substrate, and/or the presence of any photo illumination of the substrate.

A wide variety of programmable materials 130 may be used in practicing the present invention. Interconnect devices 110 having different properties may include different programmable materials 130. In one exemplary embodiment, the interconnect device 110 may be ohmic resistor-like. The value of an ohmic resistor does not change over a wide range of applied voltages and currents, therefore the ratio of voltage to current is fixed. Programmable materials suitable for the formation of ohmic resistor-like interconnect devices 110 include poly(methyl methacrylate) often abbreviated as PMMA, tantalum pentoxide $Ta_2O_5$, aluminum oxide $Al_2O_3$, $C_{18}$ monolayer, $C_{18}$ multi-layer, platinum oxide, and p-type silicon.

Application of the focused beam 150 on the PMMA may convert all or some of the PMMA to graphite, a more conductive material than PMMA, creating an electrical connection having less resistance between the first electrode 120 and the second electrode 140. Tantalum pentoxide and aluminum oxide may be converted to a material having a lower oxide state under application of the focused beam 150. The materials having a lower oxide state, such as $Ta_2O$ and $Al_2O$ may have a higher conductivity than the original tantalum pentoxide $Ta_2O_5$, and aluminum oxide $Al_2O_3$. The programmable material may additionally take on a more conductive crystalline form after the application of the focused beam 150.

Figure 4:
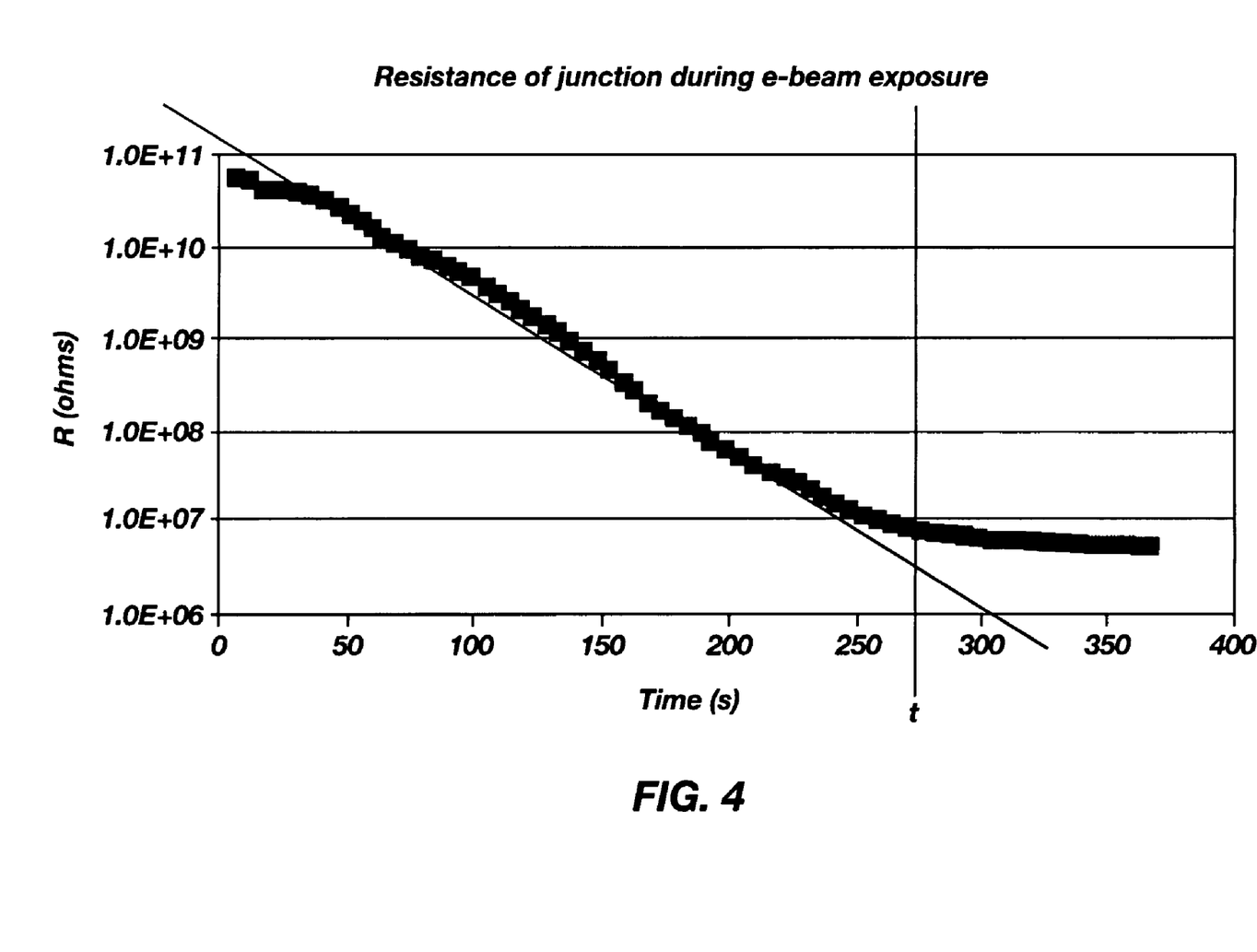
FIG. 4 is a plot of the resistance vs. time of a junction according to an embodiment of the present invention.

Conductive polymers may also be used as a suitable programmable material 130. A photoconductive polymer such as poly(N-vinylcarbazole) may show a substantial increase in conductivity under application of the focused beam 150. The change in resistance of an aliphatic imide polymer junction undergoing a 10 kV e-beam irradiation is shown in the graph of FIG. 4. The e-beam is applied for about 275 seconds, during which time the resistance of the junction changes from about 1.0E+11 Ohms to about 1.0E+07 Ohms.

Furthermore, in some embodiments, the programmable material 130 may comprise one or more elements, either layered, intermixed homogenously, or intermixed nonhomogenously.

Figure 5:
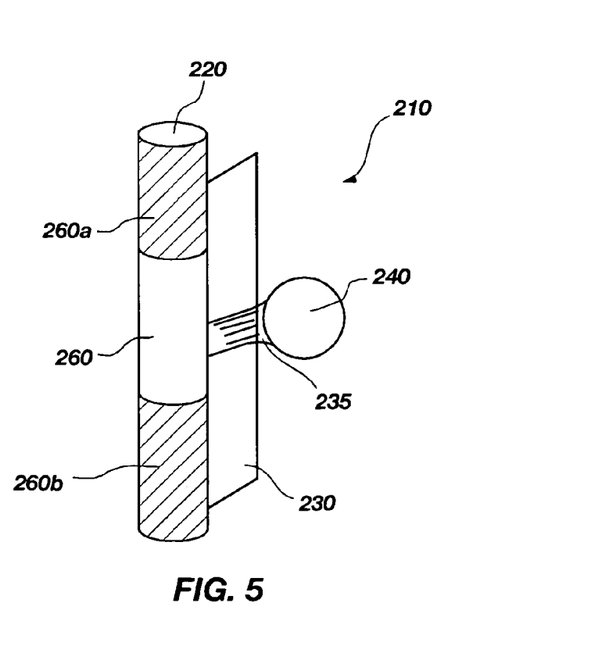
FIG. 5 is a schematic illustration of an embodiment of a nanoscale electronic device formed by a method of the present invention.

In another exemplary embodiment of the present invention, a programmable three-terminal structure, for example a configurable field effect transistor (FET) 210, may be formed, as shown in FIG. 5. The first electrode 220 may comprise a semiconductor such as silicon, and the second electrode 240 may comprise a metal. Thus, the first electrode 220 becomes a transistor and the second electrode 240 induces formation of a gate 260 in the first electrode 120 through the modified region 235 of the programmable interlayer 230. The gate is formed between source and drain regions 260a, 260b, which are defined by the creation of the gate 260 in the first electrode 220.

The second electrode 240 may comprise aluminum, silver, gold, titanium, copper, cobalt, nickel, and alloys thereof, as well as cobalt silicide, titanium silicide, and nickel silicide. Application of the focused beam to the programmable interlayer 230 may affect the resistance between the first electrode 220 and the second electrode 240 and, thus, the effective capacitance and field at the gate 260.

Figure 6:
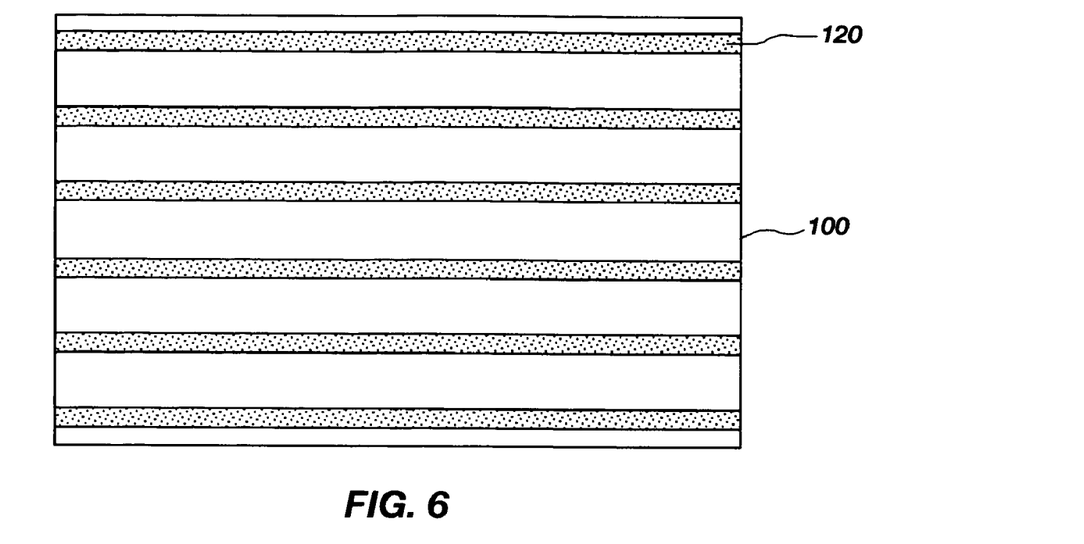
FIGS. 6-8 are schematic illustrations of yet another embodiment of a nanoscale electronic device formed by a method of the present invention.
Figure 7:
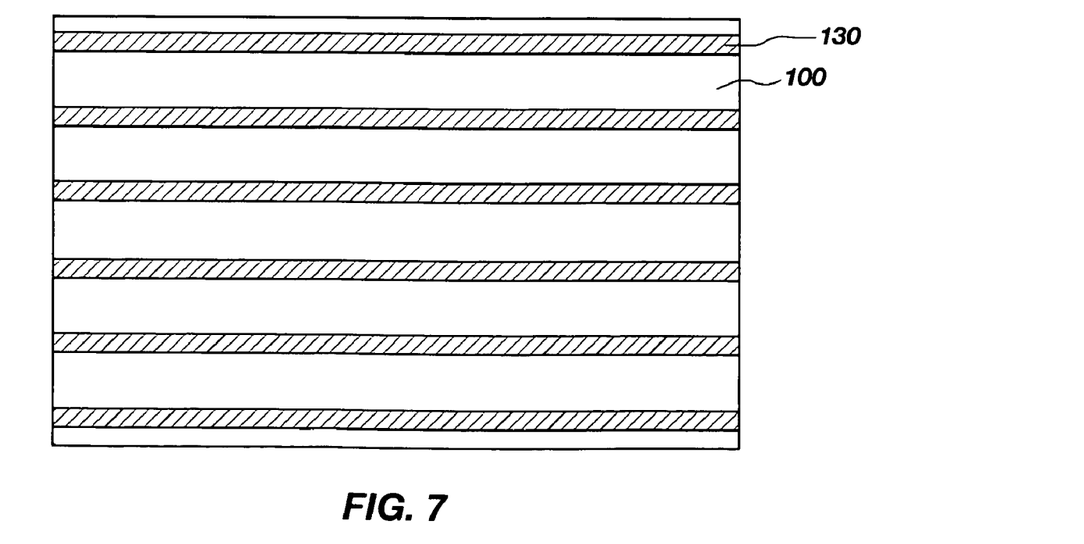
Figure 8:
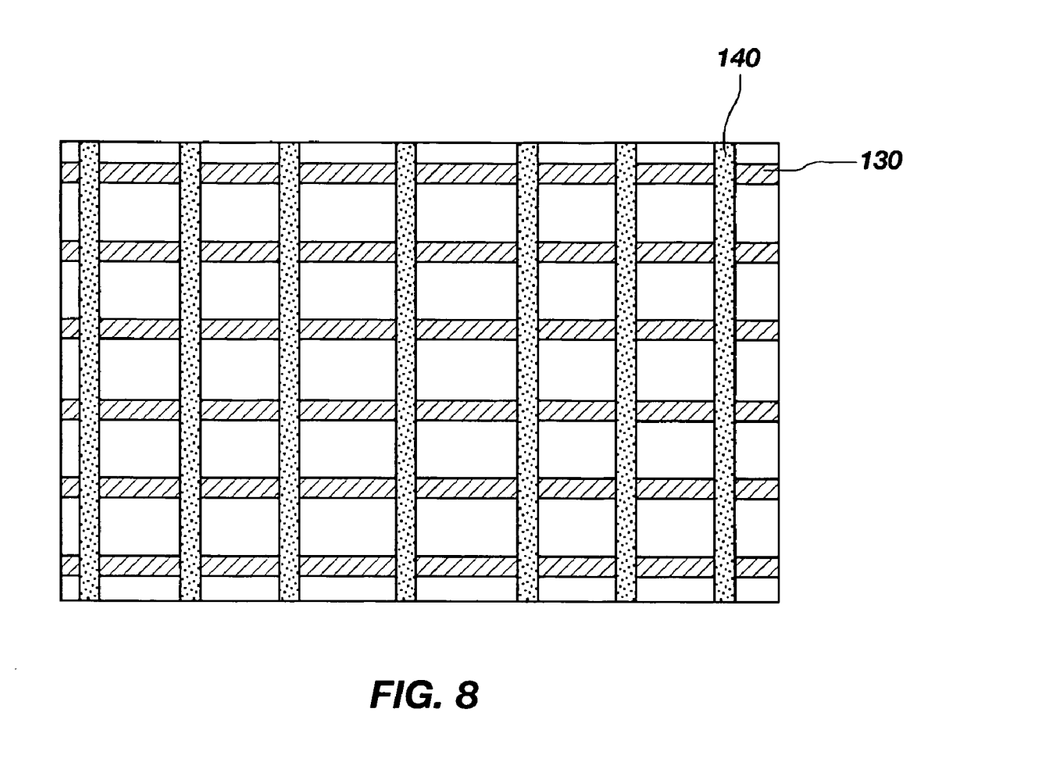

As shown in FIGS. 1-3, a single interconnect device 110 may include a bottom electrode 120, a programmable interlayer 130, and a top electrode 140. More complicated crossbar structures having multiple interconnect devices 110 may also be formed on a substrate 100, as shown in FIGS. 6-8. The interconnect devices 110 may be formed on a variety of suitable insulating or semiconducting substrates 100, such as, for example: a suitable plastic; silicon; silicon on insulator (SOI); glass; silicon oxide; sapphire; gallium arsenide; indium phosphide; or other semiconductor with or without an additional oxide or nitride coating. As used herein, the term substrate 100 includes and encompasses all such substrates.

Additionally, the interconnect devices 110 may be processed as additional layers on a semiconductor wafer where processing includes a conventional metal oxide semiconductor (MOS) process or a conventional bipolar process. The interconnect devices 110 may be fabricated on silicon dioxide. As a result, conventional MOS devices may be processed on a semiconductor wafer followed by a dielectric layer, such as silicon dioxide, silicon nitride, or silicon carbide. Vias may be formed through the dielectric to couple conventional MOS devices to interconnect devices 110. Then, the interconnect devices 110 may be formed on the dielectric to couple to the conventional MOS devices.

The bottom electrodes 120 may be formed from an electrically-conductive material, such as a semiconductor, metal, or polymer. The bottom electrode 120 may be a single layer or may be a multilayer structure having an adhesive layer and a contact layer. The adhesive layer provides adhesion between the substrate 100 and the contact layer, which functions as the bottom electrode. For the sake of simplicity, the bottom electrode 120 in FIGS. 1-8 is shown as a single layer. The adhesive layer may be formed from a metal, such as from titanium, chromium, tantalum, nickel, vanadium, or mixtures thereof. The thickness of the adhesive layer may range from approximately 1 nm to approximately 50 nm. The adhesive layer may be formed by nanoimprinting, shadow masking, or lithographic techniques.

Nanoimprinting techniques are described in U.S. Pat. No. 6,432,740 to Chen, which is assigned to the assignee of the present invention and is incorporated by reference in its entirety herein. Nanoimprinting utilizes compression molding and a pattern transfer process. A mold having nanometer-scale features is pressed into a thin photoresist cast on a substrate, which creates a thickness contrast pattern in the photoresist. After the mold is removed, a lift-off process or an anisotropic etching process is used to transfer the pattern into the entire photoresist thickness by removing the remaining photoresist in the compressed areas. Lift-off processes and etching processes are known in the art. The material of the feature to be formed, such as the metal of the adhesive layer, is deposited in indentations formed by removing the photoresist. The material is deposited by conventional techniques, such as by CVD, physical vapor deposition (PVD), sputtering, or electron beam evaporation. Nanoimprinting may be used to produce features having a feature size of less than approximately 10 nm (sub-10-nm). Nanoimprinting also provides high throughput at a low cost and causes minimal damage to other circuits components on the nanoscale electronic device.

In micron- and submicron-scale electronic devices, shadow masking or lithographic techniques may be used to form the adhesive layer. In shadow masking, a thin, metal sheet having windows may be applied to the substrate 100. The material of the feature to be formed, such as the metal of the adhesive layer, may be applied to the substrate 100 through the windows by a conventional deposition technique including, but not limited to, CVD, PVD, sputtering, or evaporation. Shadow masking may be used to form features having a feature size ranging from approximately 5 µm to approximately 10 µm. However, shadow masking may be unsuitable for forming smaller features, such as sub-micrometer- and nanometer-size features. Lithographic techniques used to pattern the adhesive layer are known in the art and, as such, are not discussed in detail herein. The lithographic techniques may include, but are not limited to, electron beam, laser ablation, focused ion beam (FIB; additive or subtractive), laser-assisted deposition, electron-assisted deposition, photo-assisted deposition, and atomic force microscope/scanning tunneling microscope (AFM/STM)-assisted deposition. The lithographic techniques may be used to form features having submicron feature sizes.

In fabricating the interconnect device, a layer comprising first electrodes 120 may be formed on a suitable substrate 100, using conventional deposition and patterning technology, such as, for example, sputter deposition, evaporation, and vapor deposition techniques and lithographic techniques including optical, ultraviolet, and electron beam techniques. Electrodes formed with conventional semiconductor techniques generally may have a somewhat rectangular cross section, although trapezoidal, circular, and rounded cross sections and combinations of the foregoing are not precluded. In addition, the first electrodes 120 may be formed by known techniques, such as, for example, chemically prepared metal nanowires and chemically prepared semiconductor nanowires. For example, the first electrodes 120 may be formed with a platinum layer of about 100 nm thickness using conventional optical lithographic techniques. Some other exemplary materials for the first electrodes are aluminum, silicon, and tungsten.

In some embodiments, it may be desirable to tailor the surface of the first electrodes 120 following deposition. For example, it may be desirable to perform planarization or smoothing processes. In addition, it may be desirable to form a nano-textured topography, or chemical species functionalization. These processes may create a smoother surface on the first electrodes 120 and reduce the possible distinct height transitions between the substrate 100 and the first electrodes 120. Furthermore, this tailoring process may enhance deposition results for the programmable material 130. Exemplary tailoring processes are described in U.S. patent application Ser. No. 10/405,294, entitled "Custom Electrodes for Molecular Memory and Logic Devices," and incorporated herein by reference.

FIG. 6 illustrates programmable material 130, which may be deposited over all or part of the substrate 100 and first electrodes 120, using material deposition methods. Examples of suitable deposition methods include: vapor deposition, self-assembled monolayers (SAM), and Langmuir-Blodgett (LB) film deposition techniques. LB film deposition, which was used in fabricating some exemplary embodiments, conventionally involves the process of creating a monolayer of a molecular compound on the surface of water or other suitable liquid. The monolayer may then be transferred to the surface of a substrate 100 by pulling the substrate through the monolayer-covered liquid. Additional monolayers may be added by repeatedly immersing and removing the substrate 100 through the monolayer-covered liquid. This technique produces a uniform coating of the programmable material 130 on the substrate 100 and over the first electrodes 120. Some embodiments of the invention may use a single monolayer. Other embodiments of the invention may use a plurality of monolayers.

As depicted in FIG. 7, a layer of second electrodes 140 may be deposited over the programmable material 130. The second electrodes 140, as well as the first electrodes 120, may be comprised of a conductive material. Some suitable conductive materials, by way of example and not limitation, are titanium, silver, aluminum, chromium, and platinum. Many different deposition techniques may be used to place the layer of second electrodes 140 on the programmable material 130, such as, conventional photolithography deposition/etching techniques, imprinting, and nanotechnology techniques (such as nanowires formation) described for the formation of the first electrodes 120. The deposition technique for the second electrodes 140 should be a technique that does not unduly damage the deposited film of programmable material 130.

To complete formation of the interconnect devices 110, each junction of the electrodes 120, 140 may be programmed by an appropriate dose of a localized, focused beam. The time and/or intensity of the beam 150 may be adjusted at each junction to provide a modified region 135 having the desired resistivity. Each junction may be individually programmed, enabling a complicated crossbar structure tailored for maximum efficiency and minimal cross-talking. Thus, an ultra-high resolution, non-lithographic method of tuning the resistance of individual switches, or junctions, is provided. Conventional lithographic techniques require multiple aligned nanoscale lithographic steps to provide a crossbar structure having a like plurality of switches.

Programmable material 130 not sandwiched between the two electrode layers at junctions of the electrodes 120, 140 may be considered excess programmable material. In some embodiments, excess programmable material may be removed after deposition of the second electrodes 140. In other embodiments, the excess programmable material may be left in place.

The programmable impedance device 110, as illustrated in FIG. 1, may be formed anywhere that a first electrode 120 and second electrode 140 cross with programmable interlayer 130 between the pair of electrodes (120 and 140). As a result, the electrode crossings do not need to be perpendicular. In fact, they may be oriented at any non-zero angle. Furthermore, while FIG. 1, illustrates the electrodes (120 and 140) configured as crossed electrodes, many other configurations are contemplated within the scope of the invention. For example, and not by way of limitation, the first and second electrodes (120 and 140) may be disposed such that the electrodes overlap partially, overlap completely, or approach each other such that there is no full crossing. In addition, the electrodes (120 and 140) may not be long thin lines as illustrated in FIG. 1. For example, and not by way of limitation, they may be shaped as a small circle or an external probe. The electrodes (120 and 140) may also be configured in a variety of cross sectional profiles, such as, for example, the rectangular profile shown, in FIGS. 2 and 3, a trapezoidal profile, a partially circular profile shown in FIG. 1, or a partially ellipsoid profile. Additionally, placement of the layer of second electrodes 140 relative to the underlying layer of first electrodes 120 may include relatively loose tolerances.

The size of the interconnect device 110 formed at the overlap, or junction, of the first electrode 120 and the second electrode 140 may vary widely. Exemplary interconnect devices 110 may be formed with lateral junction dimensions between about 10 micrometers and about 40 nanometers. The interconnect device of the present invention can continue to scale down to the nanometer-scale in lateral junction size, enabling many nanoelectronic applications. Device size may be largely a function of component density requirements and compatibility with other devices that may be fabricated on the substrate 100. For example, larger devices may be desirable, for use with conventional semiconductor devices and fabrication techniques. Similarly, smaller devices may be desirable when formed with other nanometer scale structures or processes. Additionally, other combinations of conventional semiconductor devices and nanoscale devices with the present invention are possible.

It will be readily apparent to a person of ordinary skill in the art that the configuration of first electrodes 120 and second electrodes 140 is somewhat arbitrary. The processing steps may be reversed such that the material comprising the second electrodes 140 is formed first and nearest to the substrate 100, while the material comprising the first electrodes 120 is formed last and farthest from the substrate 100.

The present invention may be used in a variety of analog and digital electronics applications, such as, for example, configuration bits for logic, impedance tuning for high speed logic & memory, impedance tuning for tight tolerance memory, impedance tuning for analog circuitry, and logical multi-level memory.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming an electrical interconnect, comprising:
providing a first electrode;
forming a programmable interlayer in contact with the first electrode;
forming a second electrode in contact with the programmable interlayer; and
exposing the programmable interlayer to a focused beam for a predetermined length of time to form a modified region in electrical contact with the first electrode and the second electrode,
wherein exposing the programmable interlayer to a focused beam is performed while both the first electrode and the second electrode are in mutual contact with the programmable interlayer.

2. The method of claim 1, wherein providing the first electrode comprises providing the first electrode formed of a conductive material.

3. The method of claim 2, wherein the conductive material is selected from the group consisting of metal, semiconductor material, semimetals, conducting oxides, and conducting organics.

4. The method of claim 2, wherein the conductive material is selected from the group consisting of platinum, titanium, and aluminum.

5. The method of claim 1, wherein forming a programmable interlayer comprises forming a programmable interlayer selected from the group consisting of $C_{18}$ monolayer, $C_{18}$ multi-layer, polymethyl methacrylate, tantalum pentoxide, aluminum oxide, platinum oxide, and p-type silicon.

6. The method of claim 1, wherein exposing the programmable interlayer to the focused beam comprises exposing the programmable interlayer to one of an electron beam, an ion beam, and a photon beam.

7. The method of claim 1, wherein exposing the programmable interlayer to the focused beam comprises controlling at least one of a beam energy, local energy field, temperature, and photon illumination to form the modified region having desired electrical properties.

8. The method of claim 1, wherein forming the programmable interlayer comprises forming the programmable interlayer having a thickness ranging from approximately 10 nm to approximately 100 nm.

9. The method of claim 1, wherein the electrical interconnect is a three-terminal structure.

10. The method of claim 9, wherein providing the first electrode comprises providing the first electrode formed of a semiconductor material.

11. The method of claim 10, wherein providing the second electrode comprises providing the first electrode formed of a metal.

12. A method of forming a nanoscale electronic device, comprising:
providing a substrate;
forming a plurality of first electrodes on the substrate;
forming a programmable interlayer in electrical contact with the first electrode;

forming a plurality of second electrodes in electrical contact with the programmable interlayer, the plurality of first electrodes crossing the plurality of second electrodes at non-zero angles to form a plurality of junctions with the programmable interlayer sandwiched between the first electrodes and the second electrodes at the junctions; and exposing the programmable interlayer to a focused beam at a selected junction of the plurality of junctions for a predetermined length of time to form a modified region that is nanoscale in size at the selected junction.

13. The method of claim 12, wherein providing the plurality of first electrodes comprises providing the plurality of first electrodes formed of a conductive material.

14. The method of claim 13, wherein the conductive material is selected from the group consisting of metal, semiconductor material, semimetals, conducting oxides, and conducting organics.

15. The method of claim 13, wherein the conductive material is selected from the group consisting of platinum, titanium, and aluminum.

16. The method of claim 12, wherein forming a programmable interlayer comprises forming a programmable interlayer selected from the group consisting of $C_{18}$ monolayer, $C_{18}$ multi-layer, polymethyl methacrylate, tantalum pentoxide, aluminum oxide, platinum oxide, and p-type silicon.

17. The method of claim 12, wherein exposing the programmable interlayer to the focused beam comprises exposing the programmable interlayer to one of an electron beam, an ion beam, and a photon beam.

18. The method of claim 12, wherein exposing the programmable interlayer to the focused beam comprises controlling at least one of a beam energy, local energy field, temperature, and photon illumination to form the modified region having desired electrical properties.

19. The method of claim 12, wherein forming the programmable interlayer comprises forming the programmable interlayer having a thickness ranging from approximately 10 nm to approximately 100 nm.

20. The method of claim 12, wherein forming the plurality of first electrodes on the substrate comprises forming the plurality of first electrodes by nanoimprinting.

* * * * *